(12) United States Patent
Morishita et al.

(10) Patent No.: US 11,961,699 B2
(45) Date of Patent: Apr. 16, 2024

(54) CHARGED PARTICLE BEAM DEVICE

(71) Applicant: Hitachi High-Tech Corporation, Tokyo (JP)

(72) Inventors: Hideo Morishita, Tokyo (JP); Teruo Kohashi, Tokyo (JP); Hiroyuki Yamamoto, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 491 days.

(21) Appl. No.: 17/416,012

(22) PCT Filed: Dec. 25, 2018

(86) PCT No.: PCT/JP2018/047514
§ 371 (c)(1),
(2) Date: Jun. 18, 2021

(87) PCT Pub. No.: WO2020/136710
PCT Pub. Date: Jul. 2, 2020

(65) Prior Publication Data
US 2022/0068593 A1    Mar. 3, 2022

(51) Int. Cl.
*H01J 37/28*      (2006.01)
*H01J 37/14*      (2006.01)
(Continued)

(52) U.S. Cl.
CPC ............ *H01J 37/222* (2013.01); *H01J 37/14* (2013.01); *H01J 37/268* (2013.01)

(58) Field of Classification Search
CPC .................................................. H01J 37/268
See application file for complete search history.

(56) References Cited

U.S. PATENT DOCUMENTS 4,658,138 A * 4/1987 Koike .................. H01J 37/268
                                                         250/306
2012/0223227 A1    9/2012 Chen et al.
(Continued)

FOREIGN PATENT DOCUMENTS

| JP | S63131453 A | 6/1988 |
| JP | 2013134879 A | 7/2013 |

(Continued)

OTHER PUBLICATIONS

Search Report dated Feb. 19, 2019 in International Application No. PCT/JP2018/047514.
(Continued)

*Primary Examiner* — Eliza W Osenbaugh-Stewart
(74) *Attorney, Agent, or Firm* — Miles & Stockbridge, P.C.

(57) ABSTRACT

A charged particle beam device which prevents an appearance of a shading contrast due to azimuth discrimination and obtains a clear magnetic domain contrast image with a high resolution and a high throughput. The charged particle beam device includes an electron beam source; a sample stage; an objective lens configured to focus electron beams on a sample; a detector that is mounted on a charged particle beam source side with respect to the objective lens and separately detects secondary electrons emitted in azimuth angle ranges of two or more different azimuths for the same observation region; an image processing and image management device including an image processing unit configured to perform synthesis after performing shading correction and contrast adjustment on an image obtained by detecting a first emission azimuth and an image obtained by detecting a second emission azimuth; an image database; and an image display unit.

15 Claims, 15 Drawing Sheets

(51) Int. Cl.
*H01J 37/22* (2006.01)
*H01J 37/26* (2006.01)

(56) References Cited

U.S. PATENT DOCUMENTS

2013/0245989 A1  9/2013  Kadowaki et al.
2015/0014531 A1  1/2015  Yamazaki et al.
2017/0316915 A1* 11/2017  Okai ..................... H01J 37/14

FOREIGN PATENT DOCUMENTS

| JP | 2013178880 A | 9/2013 |
| JP | 2014507781 A | 3/2014 |
| JP | 2018041676 A | 3/2018 |

OTHER PUBLICATIONS

Written Opinion dated Feb. 19, 2019 in International Application No. PCT/JP2018/047514.

* cited by examiner

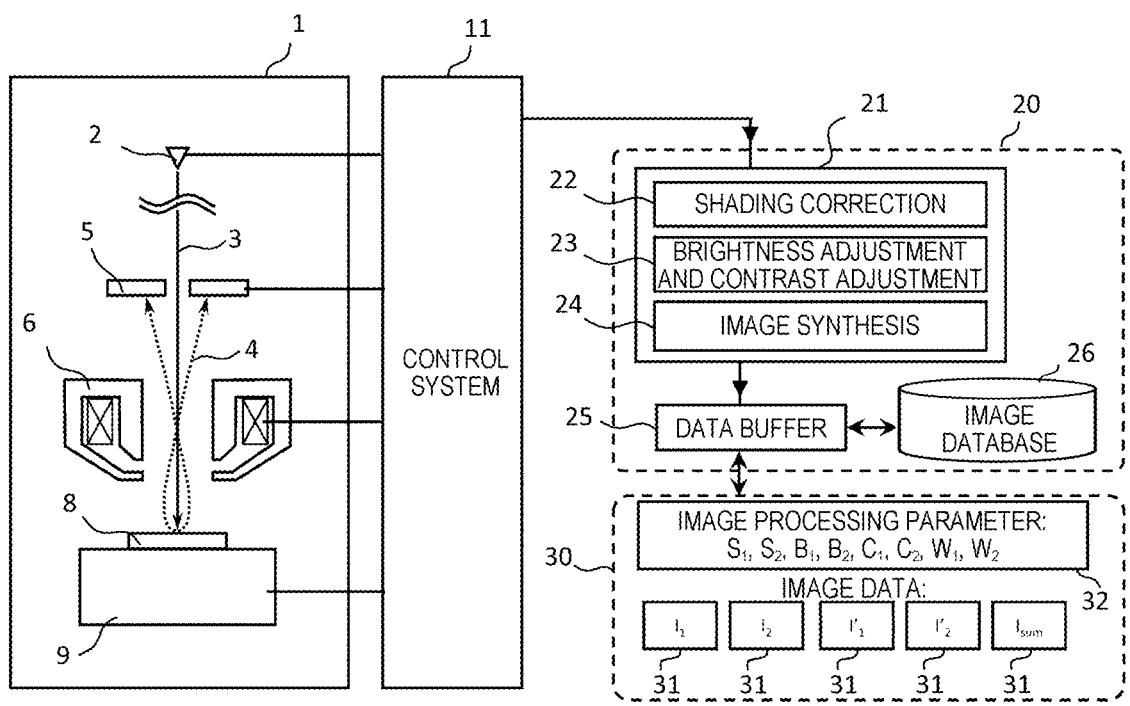
[FIG. 1]

[FIG. 2A]
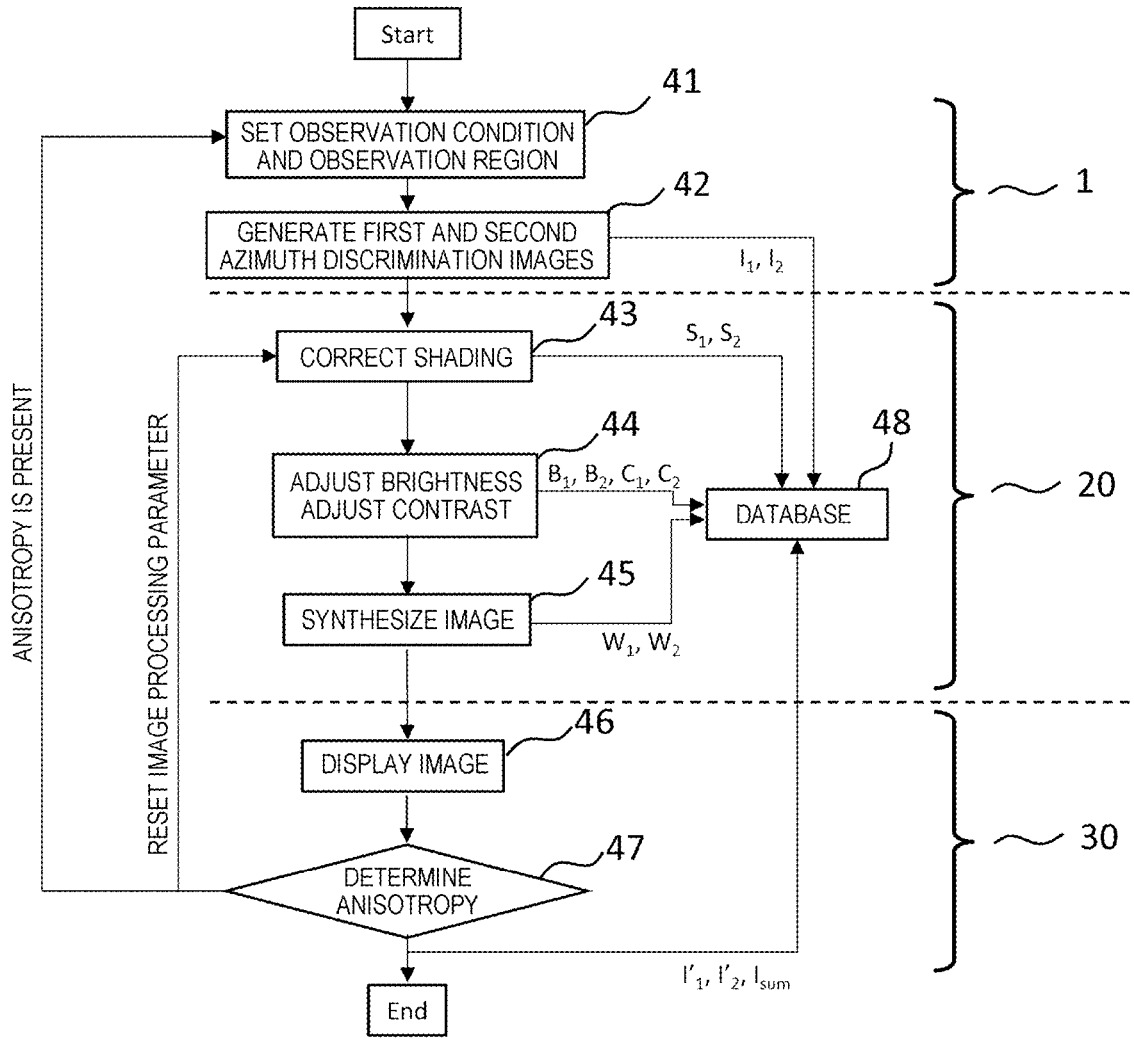
[FIG. 2B]

[FIG. 2C]
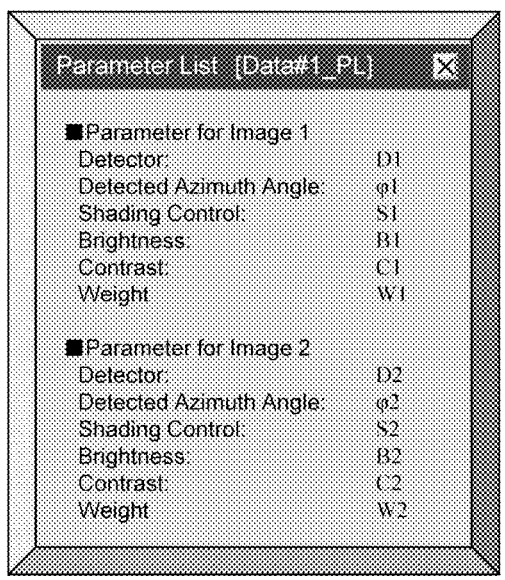
[FIG. 3]
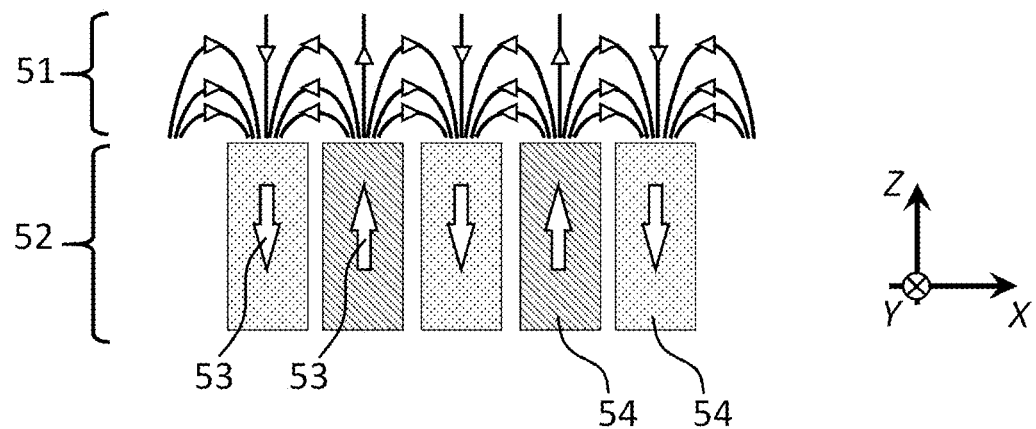

[FIG. 4]
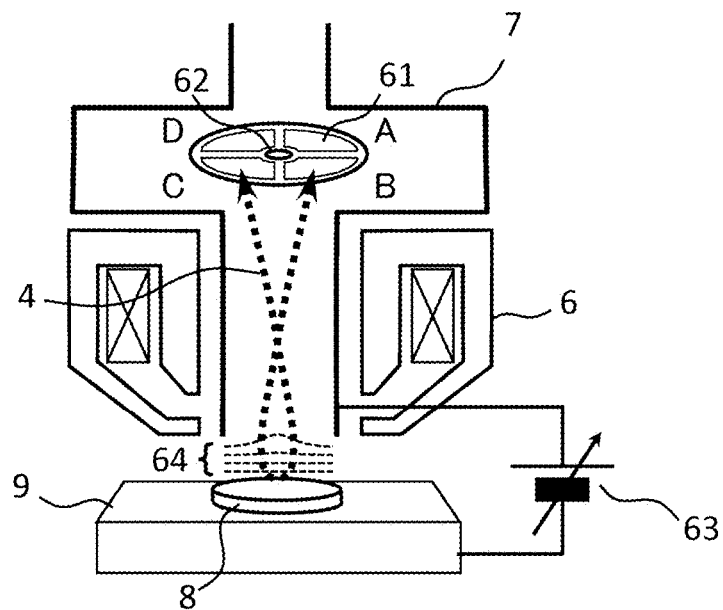
[FIG. 5A]
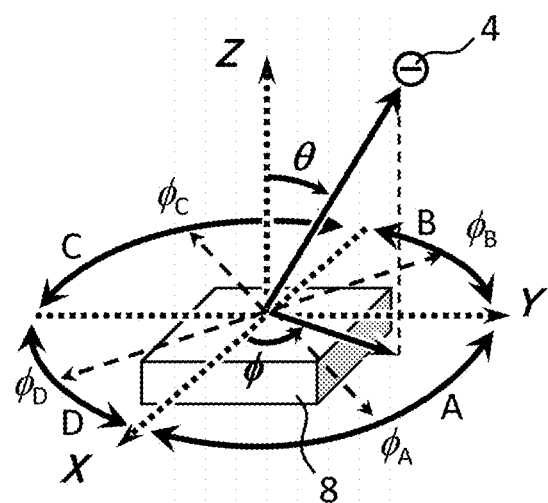

[FIG. 5B]
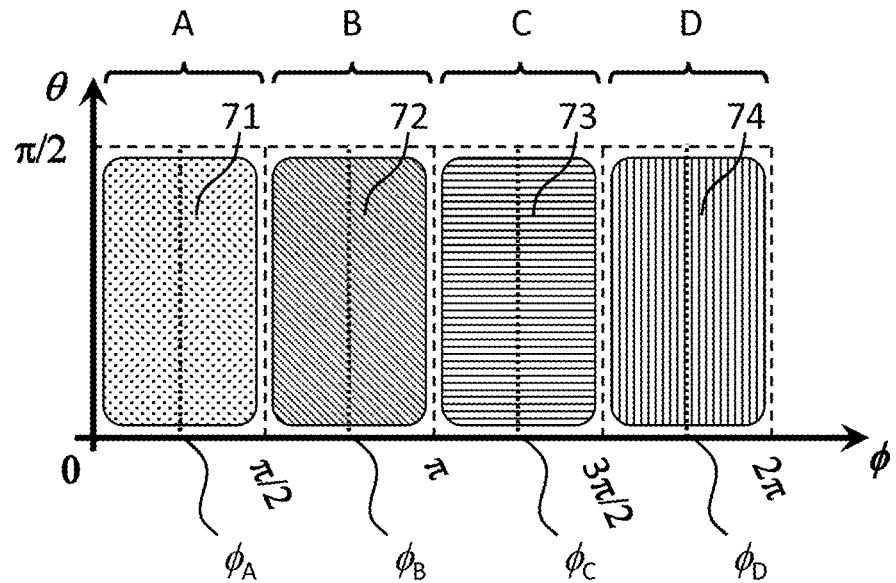
[FIG. 5C]
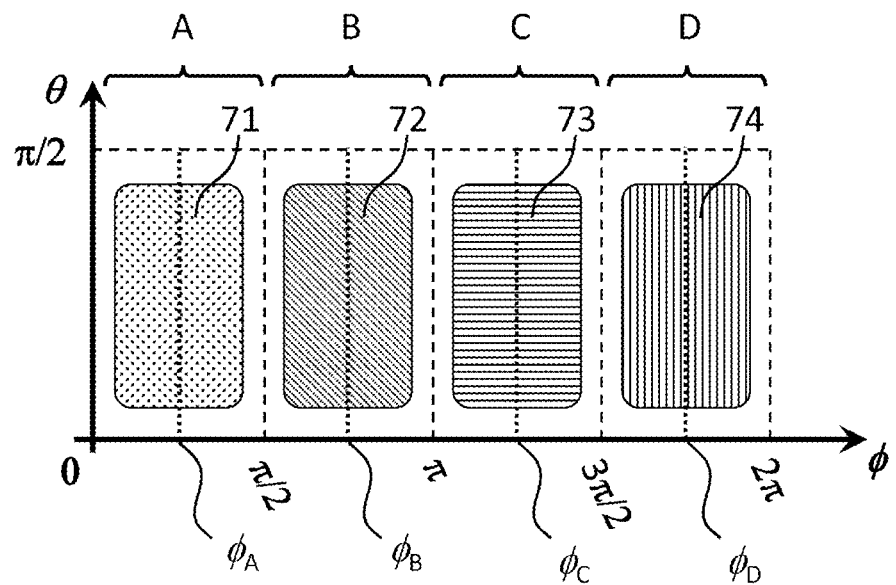

[FIG. 5D]
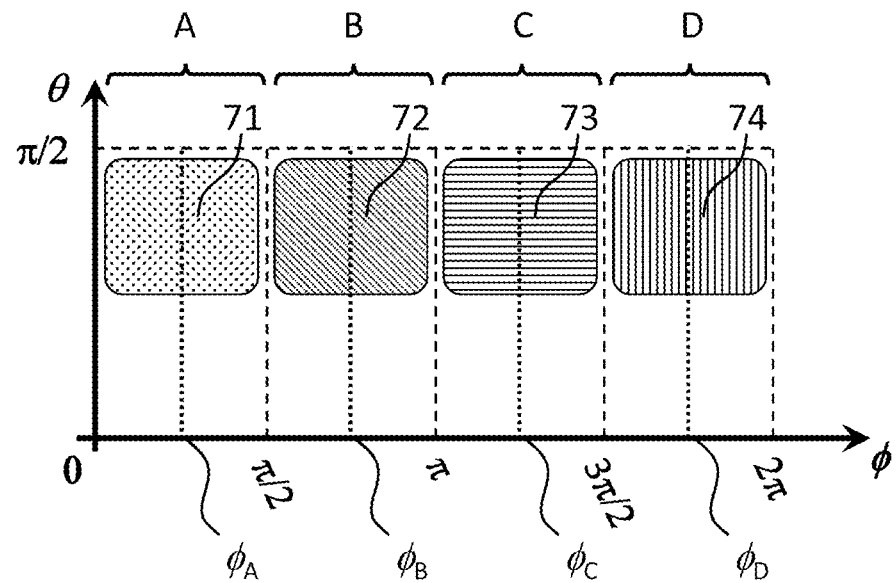
[FIG. 5E]
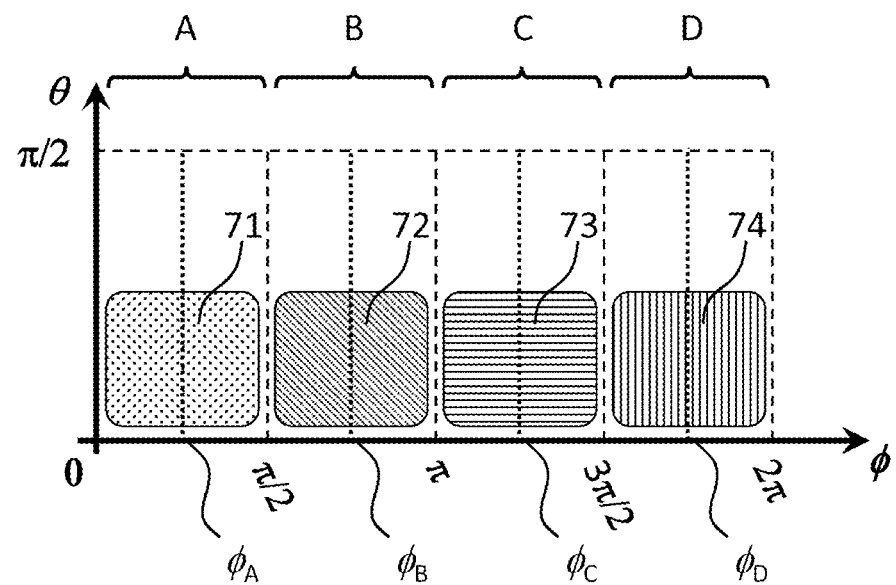

[FIG. 6A]
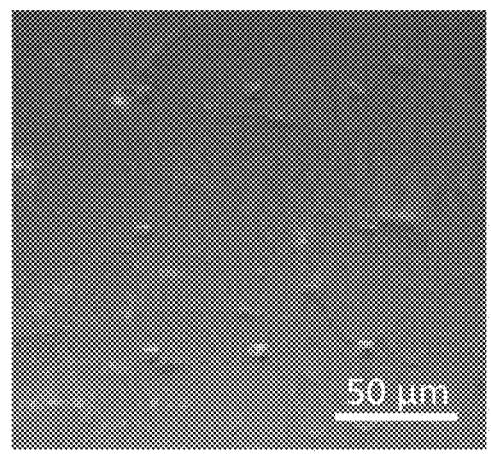
[FIG. 6B]
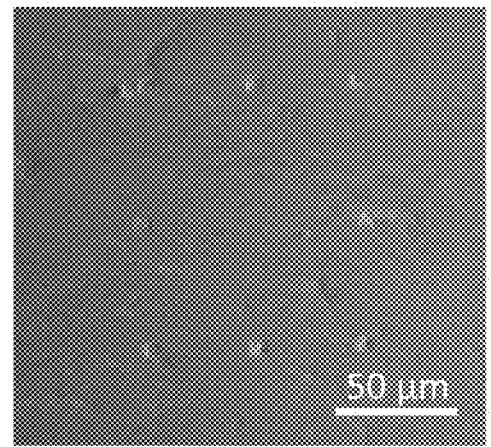

[FIG. 7A]
[FIG. 7B]
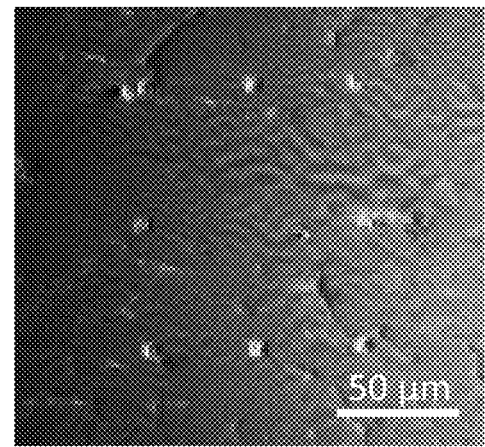

[FIG. 8A]
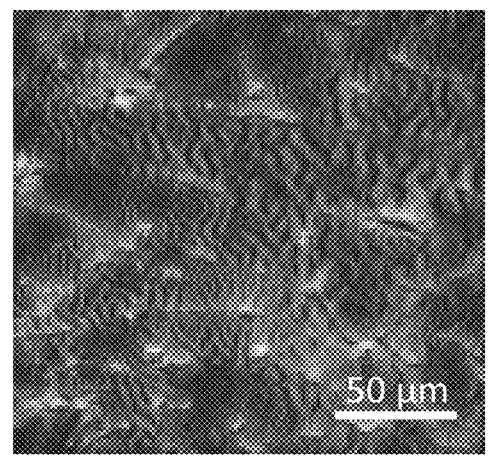
[FIG. 8B]
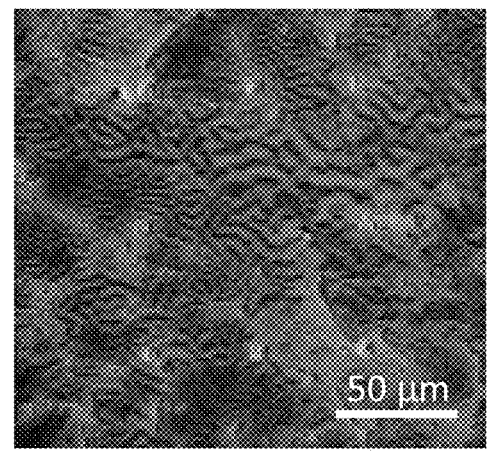

[FIG. 9]
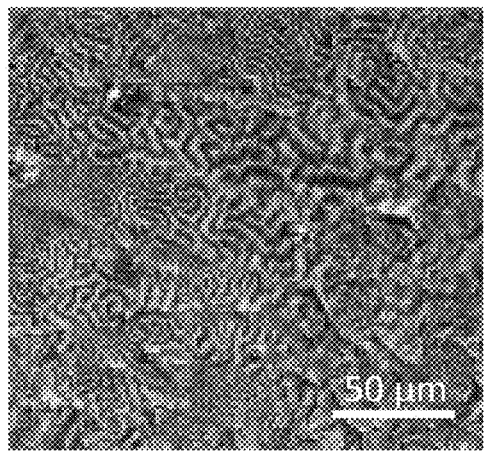
[FIG. 10]
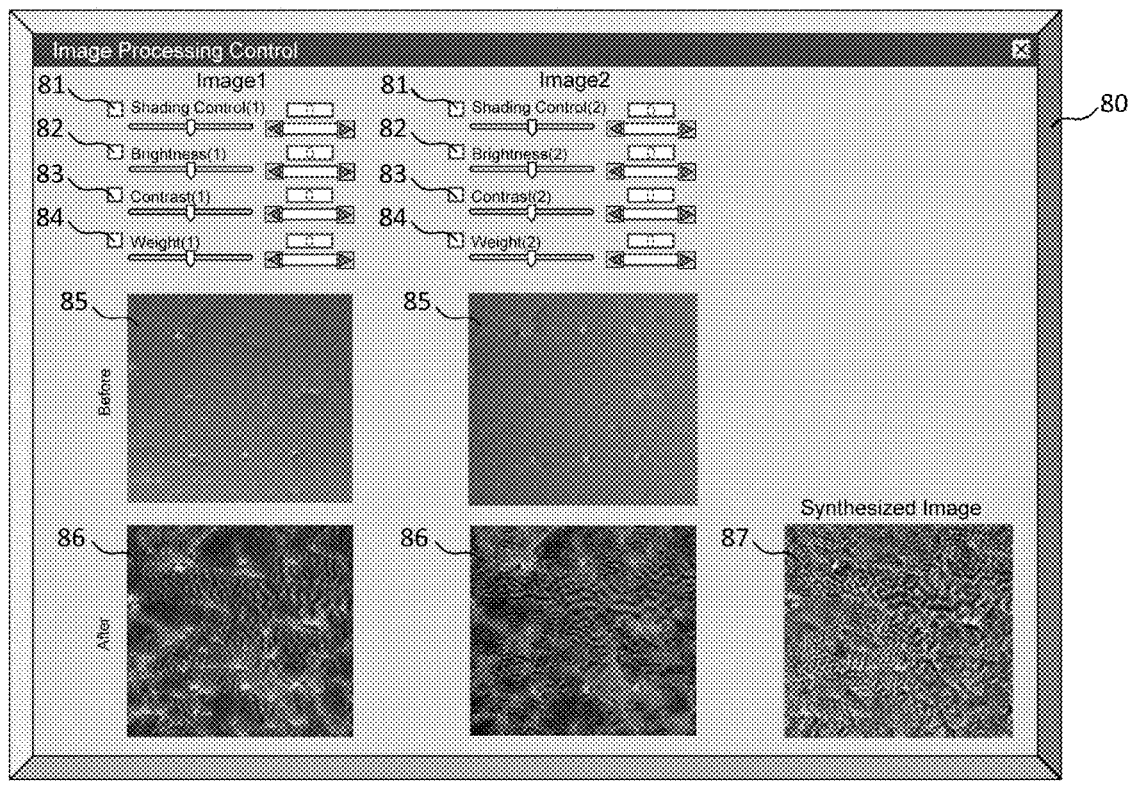

[FIG. 11A]
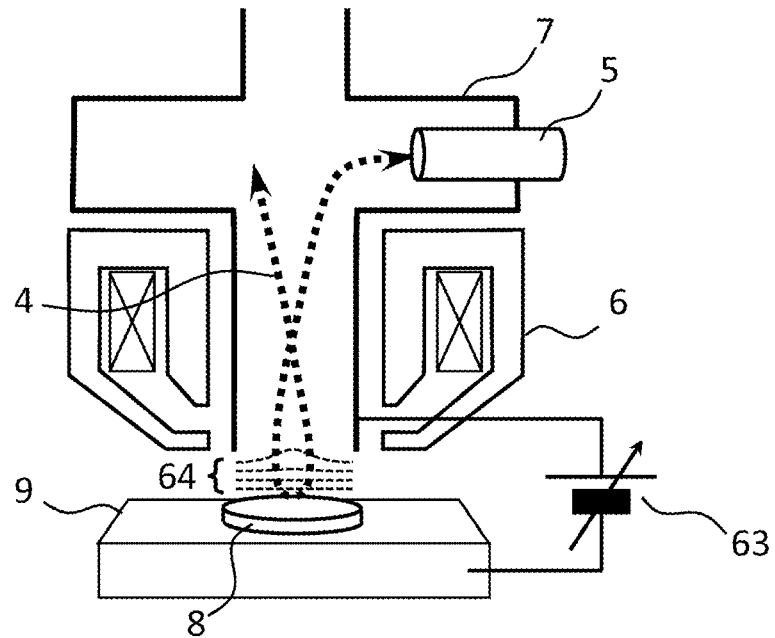
[FIG. 11B]
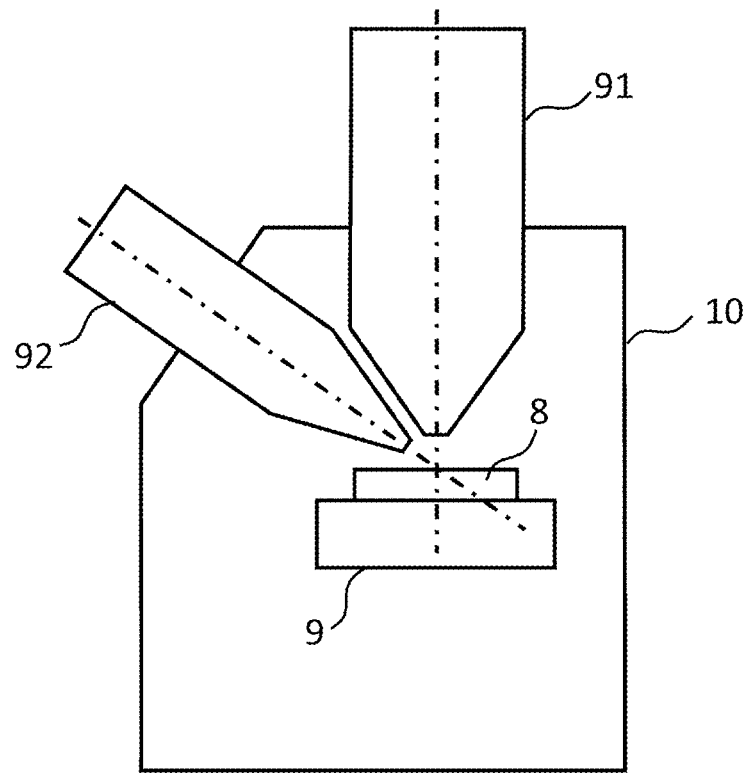

[FIG. 12A]
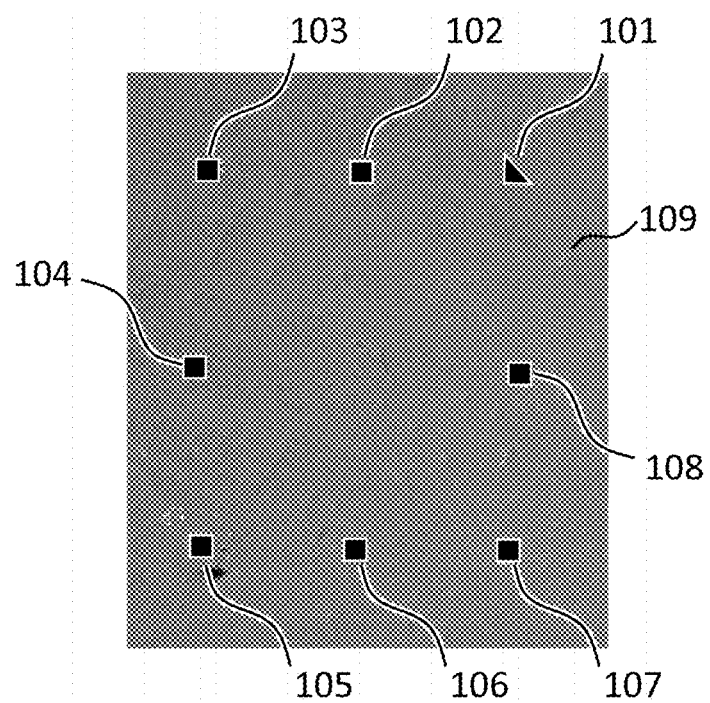

[FIG. 12B]
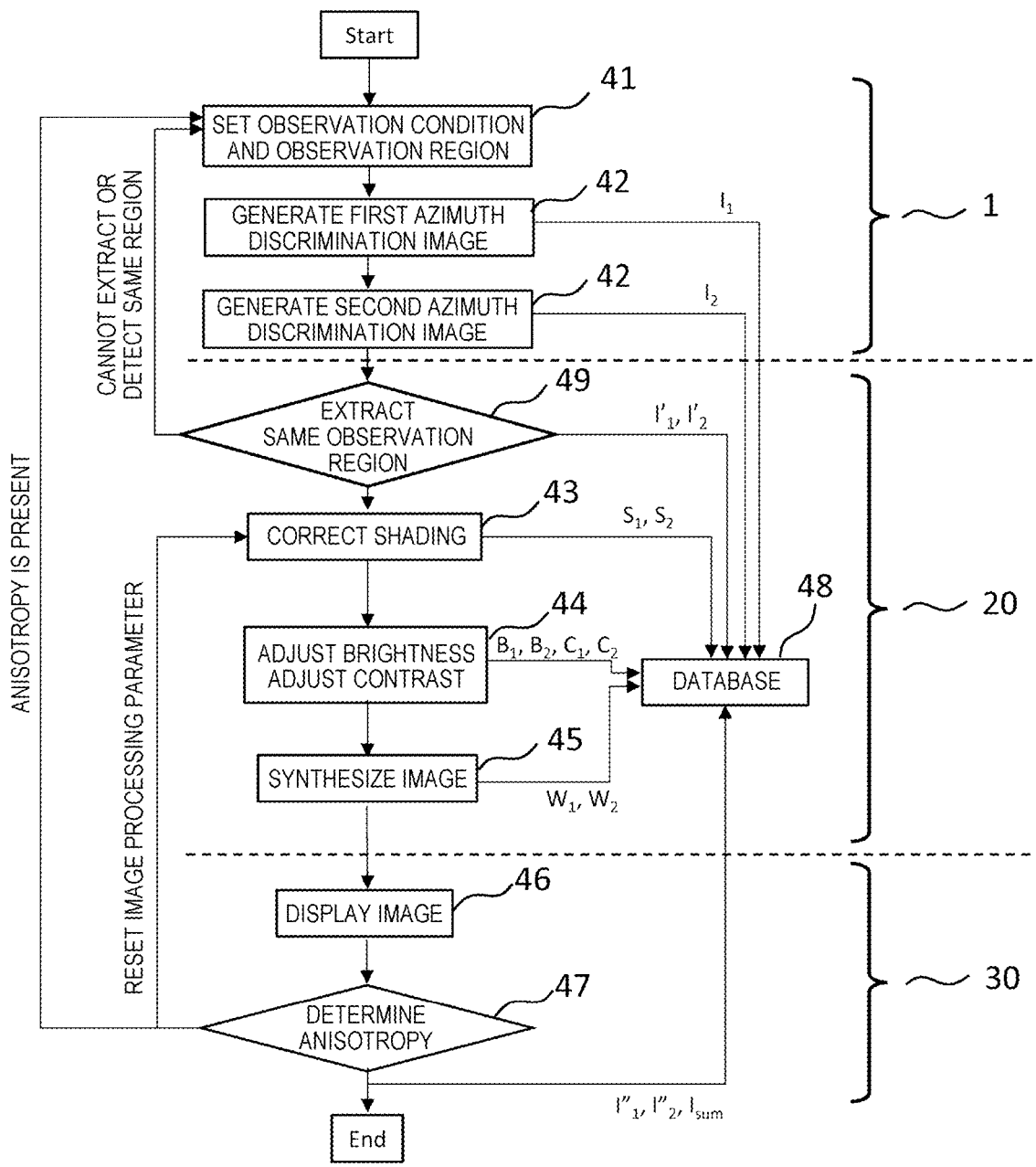

[FIG. 13]
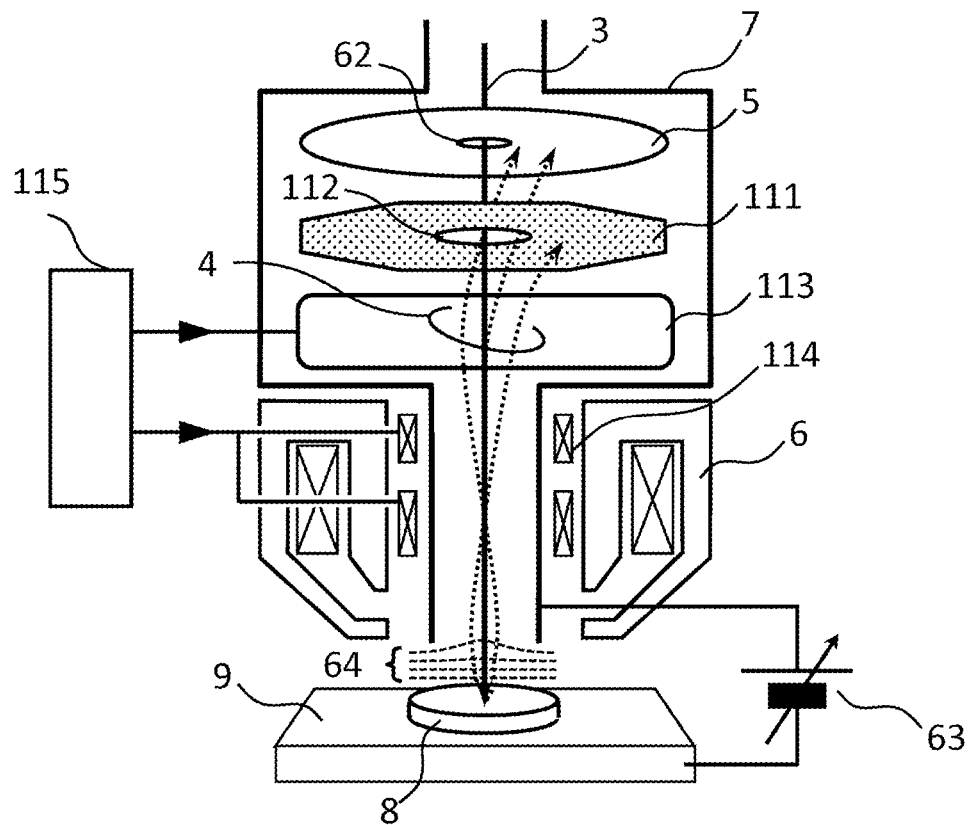
[FIG. 14A]
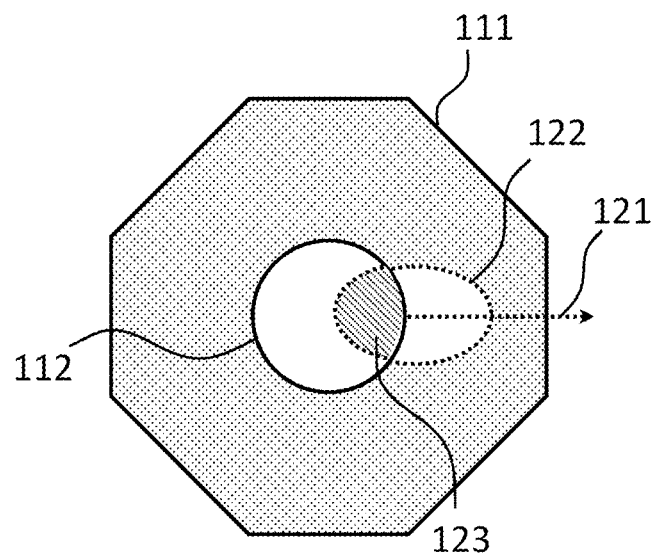

[FIG. 14B]
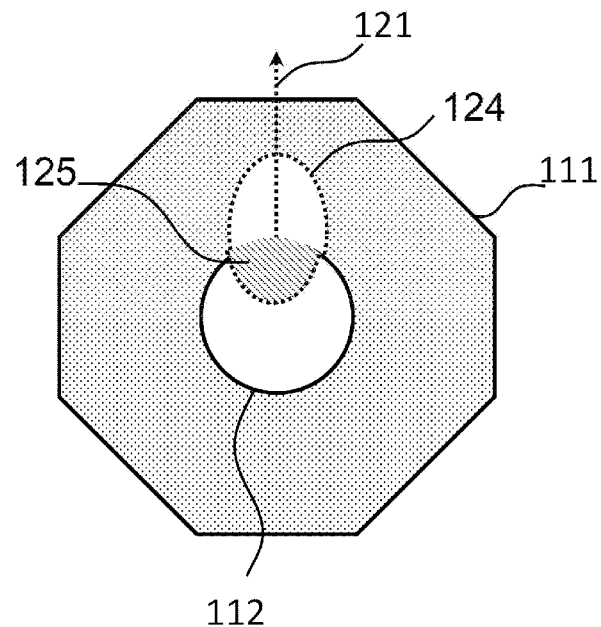
[FIG. 15]
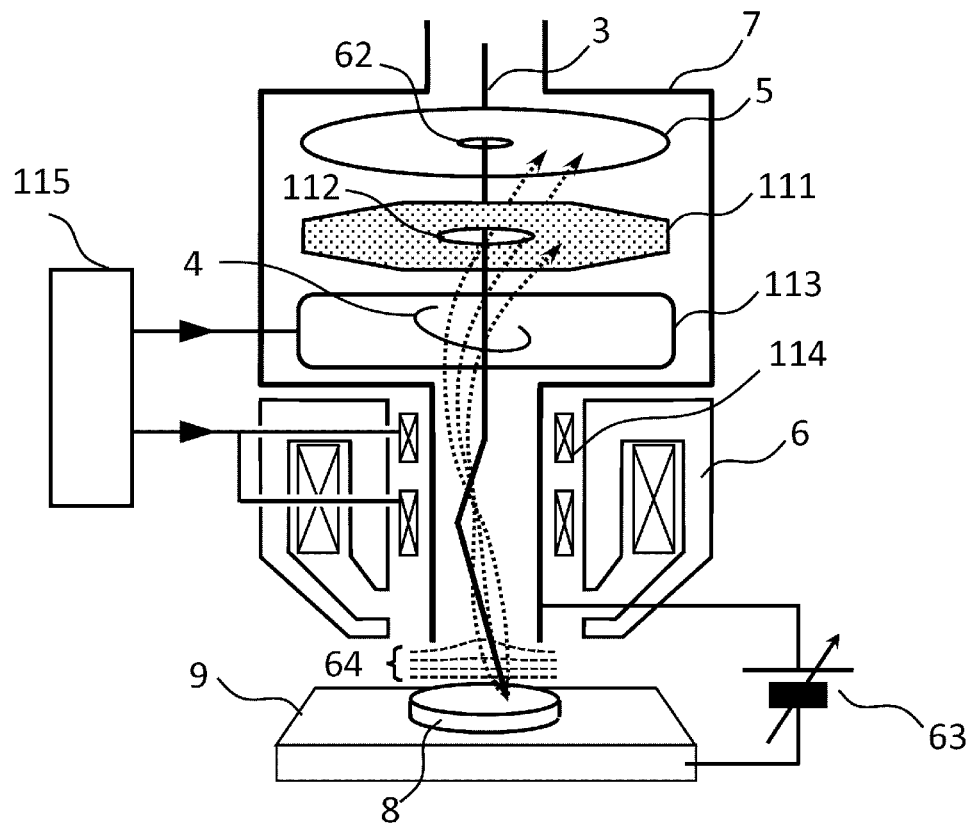

CHARGED PARTICLE BEAM DEVICE

TECHNICAL FIELD

The present invention relates to a charged particle beam device, and more particularly, to a magnetic domain contrast observation technique.

BACKGROUND ART

A scanning electron microscope (hereinafter, SEM), which is a charged particle beam device, is a device that obtains a two-dimensional image (SEM image) of a scanning region on a sample surface by detecting signal electrons generated at each irradiation position when a sample is irradiated and scanned with a focused electron beam and displaying a signal intensity of each point in synchronization with a scanning signal of an irradiation electron beam. As a method for observing or analyzing minute regions on the sample under high resolution, the SEM is used by users in a wide range of fields.

In a development of a magnetic material, it may be necessary to observe magnetic domains on a magnetic sample surface in order to determine whether a desired magnetic domain structure is obtained. As a method for observing the magnetic domain on a bulk sample surface of a magnetic body with high spatial resolution using an SEM, a method for observing a magnetic domain contrast (Type-I) using a phenomenon in which secondary electrons generated on the sample surface are deflected by a Lorentz force caused by a sample magnetic field is known (see PTL 1). PTL 1 discloses a configuration of a detection system in which secondary electrons are detected for each emission azimuth using a plurality of detectors arranged symmetrically with respect to an optical axis between an objective lens and the sample, and a ratio of detection signals of two symmetrical regions is calculated and processed.

CITATION LIST

Patent Literature

PTL 1: JP-A-S63-131453

SUMMARY OF INVENTION

Technical Problem

In SEM observation, when secondary electrons that have energy of 10 eV or less and are generated on a sample are selectively detected by irradiation with an electron beam, a contrast specific to the secondary electrons, such as an edge contrast or a potential contrast, is observed. Although in a magnetic sample having a magnetic field leakage on the surface, the Type-I magnetic domain contrast is observed, since the contrast is weaker than an edge contrast and a potential contrast, it is not easy to observe a clear magnetic domain contrast. Therefore, if contrasts other than the magnetic domain contrast are mixed, it is difficult to emphasize the magnetic domain contrast. Therefore, when a Type-I magnetic domain contrast image is observed, it is necessary to perform devising such that other contrasts such as the edge contrast and the potential contrast are not mixed as much as possible.

According to PTL 1, based on the observation principle of the Type-I magnetic domain contrast, it is effective to selectively detect secondary electrons emitted in a specific azimuth. Hereinafter, selectively detecting electrons in a specific azimuth is referred to as azimuth discrimination detection. PTL 1 discloses a configuration in which a dome-shaped grid electrode and a shielding plate are disposed directly above a sample to separately detect secondary electrons for each azimuth in order to acquire a magnetic domain contrast image by performing azimuth discrimination detection on the secondary electrons. The shielding plate partitions a region that is symmetric with respect to an irradiation electron beam. When azimuth discrimination detection is performed on the secondary electrons, particularly when observation is performed at a low magnification, a shading contrast depending on a discrimination azimuth is superimposed. When a signal calculation is performed according to the method disclosed in PTL 1, it is expected that the shading contrast is emphasized, and it is difficult to obtain an SEM image in which the magnetic domain contrast is selectively emphasized.

In view of the above problems, an object of the invention is to provide a charged particle beam device capable of acquiring a clear Type-I magnetic domain contrast image with a high resolution and a high throughput.

Solution to Problem

In order to achieve the above object, the invention provides a charged particle beam device that includes: a charged particle beam source configured to generate a charged particle beam; a sample stage; an objective lens configured to focus charged particle beams on a sample; an electric field generation unit that applies an accelerating electric field to secondary electrons generated from the sample, the secondary electrons being distributed between the sample and the objective lens; a detector that is mounted on a charged particle beam source side with respect to the objective lens and is capable of separately detecting secondary electrons emitted in azimuth angle ranges of two or more different azimuths for the same observation region; and an image processing unit configured to perform synthesis by performing shading correction and contrast adjustment on an image obtained by detecting a first emission azimuth by the detector and an image obtained by detecting a second emission azimuth by the detector.

Advantageous Effect

According to the invention, it is possible to prevent an appearance of a shading contrast due to azimuth discrimination and to obtain a clear magnetic domain contrast image with a high resolution and a high throughput.

BRIEF DESCRIPTION OF DRAWINGS

FIG. 1 is a diagram showing a configuration outline of a charged particle beam device according to a first embodiment.

FIG. 2A is a flowchart showing an image processing procedure performed by the charged particle beam device according to the first embodiment.

FIG. 2B is a diagram showing a configuration example of a database of the charged particle beam device according to the first embodiment.

FIG. 2C is a diagram showing a configuration example of a parameter list of the charged particle beam device according to the first embodiment.

FIG. 3 is a diagram showing a magnetic domain structure assumed for explaining an observation principle of a magnetic domain contrast according to the first embodiment.

FIG. 4 is a diagram showing an outline of an image acquiring device of the charged particle beam device according to the first embodiment.

FIG. 5A is a diagram showing a range of a detection angle (θ) of secondary electrons according to the first embodiment.

FIG. 5B is a diagram showing a range of an emission azimuth (φ) of the secondary electrons according to the first embodiment.

FIG. 5C is a diagram showing a range of the emission azimuth (φ) of the secondary electrons according to the first embodiment.

FIG. 5D is a diagram showing a range of the emission azimuth (φ) of the secondary electrons according to the first embodiment.

FIG. 5E is a diagram showing a range of the emission azimuth (φ) of the secondary electrons according to the first embodiment.

FIG. 6A is an observation example of a magnetic domain image obtained by discriminating and detecting a first emission azimuth according to the first embodiment.

FIG. 6B is an observation example of a magnetic domain image obtained by discriminating and detecting a second emission azimuth according to the first embodiment.

FIG. 7A shows an observation example of a magnetic domain image obtained by performing image processing on FIG. 6A.

FIG. 7B shows an observation example of a magnetic domain image obtained by performing image processing on FIG. 6B.

FIG. 8A shows an observation example of a magnetic domain image obtained by performing image adjustment on FIG. 6A.

FIG. 8B shows an observation example of a magnetic domain image obtained by performing image adjustment on FIG. 6B.

FIG. 9 shows an observation example of a magnetic domain image obtained by synthesizing FIGS. 8A and 8B.

FIG. 10 is a diagram showing an example of a GUI display of the charged particle beam device according to the first embodiment.

FIG. 11A is a diagram showing an outline of a charged particle beam device according to a second embodiment.

FIG. 11B is a schematic configuration diagram showing the charged particle beam device according to the second embodiment.

FIG. 12A is a diagram showing a shape example of an FIB milling trace according to the second embodiment.

FIG. 12B is a flowchart showing an image processing procedure performed by the charged particle beam device according to the second embodiment.

FIG. 13 is a diagram showing an outline of an image acquiring device of a charged particle beam device according to a third embodiment.

FIG. 14A is a diagram showing a secondary electron arrival position on an angle-limited diaphragm.

FIG. 14B is a diagram showing another secondary electron arrival position on the angle-limited diaphragm.

FIG. 15 is a diagram showing an outline of a charged particle beam device according to a fourth embodiment.

DESCRIPTION OF EMBODIMENTS

Hereinafter, various embodiments of the invention will be described in detail with reference to drawings. In the following description of the embodiments, although an SEM will be described as an example of a charged particle beam device, the charged particle beam device is not limited to the SEM and may be left to another charged particle beam device.

First Embodiment

A charged particle beam device according to the present embodiment has a configuration including: a charged particle beam source configured to generate a charged particle beam; a sample stage; an objective lens configured to focus charged particle beams on a sample; an electric field generation unit that applies an accelerating electric field to secondary electrons generated from the sample, the secondary electrons being distributed between the sample and the objective lens; a detector that is mounted on a charged particle beam source side with respect to the objective lens and is capable of separately detecting secondary electrons emitted in azimuth angle ranges of two or more different azimuths for the same observation region; and an image processing unit configured to perform synthesis by performing shading correction and contrast adjustment on an image obtained by detecting a first emission azimuth by the detector and an image obtained by detecting a second emission azimuth by the detector.

FIG. 1 is a conceptual diagram showing a configuration of the charged particle beam device according to the first embodiment. The configuration of the charged particle beam device shown in the same figure is also used in other embodiments. The charged particle beam device in FIG. 1 includes an image acquiring device 1, a control system 11 thereof, an image processing device and image management device 20 including an image database that accumulates images, and an image display unit 30 that displays images.

The image processing device and image management device 20 includes an image processing unit 21 including a shading correction processing unit 22, a brightness and contrast adjustment unit 23, and an image synthesis unit 24, a data buffer 25, and an image database 26. The image processing device and image management device 20 can be implemented by program processing of a personal computer (PC) including a central processing unit (CPU), a storage unit, a display, and the like together with a part of the control system 11 and the image display unit 30. Image data 31 and image processing parameters 32, which will be described later, are displayed on the image display unit 30.

FIG. 2A shows an example of a flowchart of an image processing procedure performed by the image processing device and image management device 20 according to the present embodiment. In the present embodiment, a configuration and a processing procedure of the image processing device and image management device 20 will be described. The image processing device and image management device 20 perform shading correction processing for preventing an adverse influence of a shading contrast superimposed on an azimuth discrimination detection image and image synthesis processing for reducing anisotropy of a magnetic domain contrast.

The image acquiring device 1 using a charged particle beam according to the present embodiment is an SEM. The SEM includes an electron gun 2 including a mechanism that irradiates the sample 8 with an irradiation electron beam 3, an electron optical system including a condenser lens, an objective lens 6, and the like that focus the irradiation electron beam 3 emitted from the electron gun 2 on the sample 8, a deflector that causes the sample 9 to be scanned with the irradiation electron beam 3, a sample stage 9 and a mechanism thereof that moves the sample 8 to a desired position and tilts the sample to a desired angle, a detector 5 of the secondary electrons 4 emitted from the sample 8, a control system 11 that controls an entire device such as an electron optical system of the SEM, a vacuum evacuation facility, and the like.

In addition to various electron guns used in existing SEMs such as a cold cathode electric field emission type electron gun, a Schottky emission type electron gun, and a thermal electron emission type electron gun, the configuration of the electron gun 2 corresponds to all electron guns that are applicable to electron microscopes and have configurations similar to those of the various electron guns, and an appropriate electron gun is selected according to desired observation performance.

When the sample 8 is a magnetic body, a desired magnetic domain image cannot be obtained if the sample is magnetized due to a leakage magnetic field of the objective lens. Therefore, it is preferable that the objective lens 6 has an out-lens type magnetic path configuration in which magnetic field leakage is small. A retarding method or a boosting method, which will be described later, may be applied to the out-lens type objective lens. Alternatively, when it is necessary to completely block the leakage magnetic field for the sample, the objective lens may be only an electric field lens such as an einzel lens or a bipotential lens without using a magnetic field type objective lens.

The configuration of the detection system that observes the magnetic domain contrast with emphasis according to the present embodiment will be described in detail below. In order to simplify a situation, a magnetic sample is considered in which a sample magnetization direction is either upward or downward relative to the sample surface, and magnetic domains having reverse magnetization directions of adjacent magnetic domains and the same magnetization amount are arranged at equal intervals in an X direction, and a situation is assumed in which striped magnetic domains are distributed on the sample surface. The sample surface is arranged parallel to an XY plane, and a Z direction is a normal direction of the sample. An XZ cross-sectional view of such a magnetic sample has a structure as shown in FIG. 3. In such a magnetic sample 52, a leakage magnetic field 51 distributed in a horizontal direction of the sample surface is only an X component, and a Y component has no magnetic field distribution ($B_x \neq 0$ and $B_y=0$). The secondary electrons generated on a surface of the magnetic sample 52 are deflected in a direction orthogonal to a velocity vector and a magnetic field vector by receiving a Lorentz force F calculated according to the following equation.

$$F=(-e)v \times B \quad \text{(Equation 1)}$$

In Equation 1, e is an elementary electric quantity, v is a velocity vector of an electron, and B is a magnetic field vector. The magnetic field vector directly above the sample is expressed as $B=(B_x, 0, B_z)$. In consideration of the secondary electrons emitted in the normal direction (Z direction) of the sample, the velocity vector of the electrons directly above the sample is $v=(0, 0, v_z)$, and according to Equation 1, the Lorentz force acting on the secondary electrons is calculated as $F=(0, -ev_zB_x, 0)$. Therefore, according to a sign of $B_x$, the secondary electrons are deflected to Y>0 or Y<0. Therefore, in the magnetic sample 52 in FIG. 3, a magnetic domain contrast image is obtained using the azimuth discrimination detector in a Y direction. More specifically, in the case of an azimuth discrimination detection system on a side of Y>0, a region in which the leakage magnetic field is distributed in a direction of X>0 is observed to be dark, and a region in which the leakage magnetic field is distributed in a direction of X<0 is observed to be bright. When the detector is mounted on a side of Y<0, a contrast is inverted. When the azimuth discrimination detector is provided in the X direction with respect to the magnetic sample 52 in FIG. 3, the magnetic domain contrast is hardly observed. When secondary electrons in all directions are taken in without azimuth discrimination, the magnetic domain contrasts generated by bending in opposite directions cancel each other out, and therefore the magnetic domain contrasts are observed to be weak.

In a magnetic domain contrast observation method according to the present embodiment, it is effective to have a configuration in which the secondary electrons 4 accelerated in a direction away from the sample by the electric field formed between the sample 8 and the objective lens 6 are detected by the detector 5 mounted on an electron source side with respect to the objective lens 6. Since the leakage magnetic field of the magnetic sample is distributed near the sample surface, magnetic domain information can be obtained with high sensitivity when the secondary electrons 4 are subjected to a deflection action by the Lorentz force in a low-speed region with an energy of 10 eV or less immediately after the generation of the secondary electrons 4. When the secondary electrons 4 are slightly deflected on the sample due to the leakage magnetic field derived from the sample, a difference in arrival positions of the secondary electrons 4 is remarkably reflected at a position sufficiently distant from the sample 8, and therefore an influence of the sample magnetic field is sensitively detected.

Therefore, the SEM according to the present embodiment is constituted by the objective lens 6 to which the retarding method, the boosting method, or both of the retarding method and the boosting method are applied. In the retarding method, a housing of the SEM is set as a grounded potential by an electric field generation unit and a negative voltage of several kV is applied to the sample, while in the boosting method, a cylindrical electrode to which a positive voltage of several kV is applied by an electric field generation unit is provided on a path of an irradiation electron beam for a sample at the grounded potential. Therefore, although a distribution region of the electric field is the same regardless of which of the methods is applied, the retarding method and the boosting method are often distinguished from each other depending on a method of gaining the grounded potential.

The secondary electrons 4 accelerated by a retarding electric field 64 generated by a retarding power supply 63, which is the electric field generation unit shown in FIG. 4, are accelerated to an energy of several keV, and pass through a magnetic field region of the objective lens 6. The Lorentz force acts as a rotating action about a lens axis with respect to the electron beam passing through a lens magnetic field. When an energy of the secondary electrons is several keV or more, it is possible to pass the lens magnetic field while preserving an azimuth angle distribution when the secondary electrons are emitted on the sample. In the objective lens in which the retarding method or the boosting method is applied to the objective lens of the SEM, since a focal length in a low acceleration region can be shortened, it is advantageous in attaining high resolution.

Further, generally, when an irradiation voltage is reduced, a secondary electron yield increases, and thus an amount of the secondary electrons emitted from the sample with respect to the same irradiation current increases as an acceleration voltage decreases. In the present embodiment, for a purpose of observing the magnetic domain contrast caused by secondary electrons, it is possible to improve an image S/N when the magnetic domain contrast is observed under low acceleration conditions.

FIG. 4 shows a configuration example of the detector 5 that implements the azimuth discrimination detection as described above. In the configuration example, a retarding method in which a negative voltage is applied to the sample 8 by a retarding power supply 63 is applied to the objective lens 6 of the SEM, and a semiconductor detector 64 in which a sensing surface is divided into four is mounted on an electron source side with respect to the objective lens 6. Sensing surfaces A, B, C, and D of the detector 64 have the same detection solid angle, and an azimuth discrimination image is obtained by each detector.

Definitions of a zenith angle (θ) and an azimuth angle (0 of the secondary electrons 4 emitted from the sample 8 are as shown in FIG. 5A. Central angles of emission azimuth angle zones for the azimuth discrimination detection are defined as $\varphi_A$, $\varphi_B$, $\varphi_C$, and $\varphi_D$ with respect to the sensing surfaces A, B, C, and D as shown in an example in FIG. 5B. It is desirable that the emission azimuth angle zones of the secondary electrons detected when the azimuth discrimination image is obtained have a relationship of angles substantially orthogonal to each other (for example, $|\varphi_A - \varphi_B| = \Pi/2$). In other words, a first emission azimuth and a second emission azimuth, which are two different emission azimuths, are azimuths in which central azimuths thereof are substantially orthogonal to each other.

In a more preferable detection condition, when the secondary electrons 4 are detected by the detector 64, as shown in FIG. 5B, it is preferable that azimuth discrimination detection of the angle ranges can be performed separately without overlapping and without an angle zone in which the secondary electrons 4 are not detected. That is, a detection angle range 71 of the detector A and a detection angle range 72 (or 74) of the detector B or D are preferably formed such that, an angle range is able to be detected in which the angle range of the zenith angle θ is the same and the angle zone of the azimuth angle φ is different only by π/2.

A diagram showing the angle zones of the signal electrons detected by the detectors as shown in FIG. 5B is called a detection acceptance diagram. Examples of a detection acceptance diagram allowed in an observation of the magnetic domain contrast image according to the present embodiment include, in addition to the diagram shown in FIG. 5B, a diagram shown in FIG. 5C in which an azimuth angle zone that cannot be partially detected is present, a diagram shown in FIG. 5D in which the angle zone of the detected zenith angle is biased near the optical axis (θ=0 deg), a diagram shown in FIG. 5E in which the angle zone is biased near the horizontal direction (θ=90 deg), or detection acceptance diagrams similar to the above.

A minimum number of the azimuth discrimination images to be image-synthesized based on the magnetic domain observation method according to the present embodiment is two azimuths corresponding to a freedom degree of the Lorentz force in a horizontal plane. Since an azimuth discrimination image positioned in an opposing azimuth is calculated for a purpose of observing the magnetic domain contrast in a more emphasized manner, a detector configuration may be adopted in which azimuth discrimination detection of two or more azimuths can be attained. Here, as an example of a case of synthesizing a minimum number of azimuth discrimination images of two azimuths, in FIG. 5B, a minimum number of the azimuth discrimination images to be image-synthesized is two azimuths corresponding to a freedom degree of the Lorentz force in the horizontal plane.

Therefore, in the following, as an example of a case of synthesizing azimuth discrimination images of two azimuths, a case of synthesizing azimuth discrimination images of two orthogonal azimuths which are an SEM image obtained at the sensing surface A and an SEM image obtained at the sensing surface B will be described. That is, in a sensing surface of the detector that detects the first emission azimuth and a sensing surface of the detector that detects the second emission azimuth, the azimuths at central portions of the sensing surfaces of the detectors facing from the optical axis may be substantially orthogonal to each other.

The sensing surfaces of the detectors are not limited to A and B, and similar effect can be expected as long as the sensing surfaces are combinations of detectors that detect adjacent azimuth angle zones, such as B and C, C and D, and D and A. That is, the detector has a sensing surface divided into a plurality of pieces which are symmetrical relative to the optical axis. When a plurality of images having different emission azimuths can be acquired by the same scan by a detector having a plurality of sensing surfaces or a plurality of detectors that can separately detect a plurality of azimuths as in the present embodiment, it is possible to synthesize an image in which each pixel in the image and an irradiation position completely coincide with each other, and thus it is not necessary to adjust a deviation of a position or a size of an irradiation region among the plurality of images.

The detector is not limited to the semiconductor detector of a split sensing surface, and any detector may be used as long as the detector is mounted so as to perform azimuth discrimination detection and can serve as an SEM to detect the secondary electrons. Specifically, the detector may be an avalanche photodiode detector (APD), a Si-PM detector, an Everhart & Thornley type detector using a scintillator (phosphor) on the sensing surface, a micro-channel plate (MCP), a detector using a channeltron, or the like. The detection method is not limited to a method of directly detecting flying secondary electrons as described above, and may be a method of detecting converted electrons that have low energy and are generated by causing the secondary electrons to collide with a conversion electrode.

Next, an image processing procedure for reducing the anisotropy to be superimposed on the obtained azimuth discrimination image will be described based on the azimuth discrimination image actually acquired by the SEM. FIGS. 6A and 6B show azimuth discrimination images acquired using a neodymium iron-boron alloy as the sample. FIGS. 6A and 6B are azimuth discrimination secondary electron images acquired in the same region for the azimuths in which the emission azimuths are in an orthogonal relationship to each other in FIG. 5B. The magnetic domain contrast is observed as a wavy striped contrast. Since the azimuth discrimination detection is performed, superimposition of the shading contrast appears to be more remarkable as a magnification of the image is lower. Under an observation condition of FIG. 6A, a lower part of the screen is more likely to be detected, and an upper part of the screen is less likely to be detected. On the other hand, under an observation condition of FIG. 6B, a right part of the screen is more likely to be detected, and a left part of the screen is less likely to be detected.

FIGS. 7A and 7B show images in which the contrast of each image is adjusted in order to emphasize the magnetic domain contrast. Although the magnetic domain contrast of the region observed to be moderately bright can be emphasized and observed, the magnetic domain contrast of the region observed to be dark is invisible. On the other hand, when the luminance and the contrast are adjusted such that the magnetic domain contrast of the region observed to be dark is moderately emphasized, the magnetic domain contrast of the region observed to be bright is saturated and is invisible.

In order to solve this problem, the shading correction processing is effective. FIGS. 8A and 8B show images obtained by performing contrast adjustment on the azimuth discrimination images of FIGS. 6A and 6B after the shading correction processing. By performing the shading correction processing and the contrast adjustment, an SEM image in which the magnetic domain contrast is uniformly emphasized over an entire image is obtained. In the present specification, the contrast adjustment includes a case of performing adjustment on a contrast or a case of performing adjustment on brightness and a contrast.

On the other hand, although FIGS. 8A and 8B are SEM images obtained by observing the same region, the magnetic domain contrast in which stripes in an upper-lower direction are emphasized in FIG. 8A and stripes in a left-right direction are emphasized in FIG. 8B is obtained, and appearances of the magnetic domain contrasts are different. As described above, the magnetic domain contrast image obtained by the azimuth discrimination detection has the anisotropy of the emission azimuth superimposed thereon, and a magnetic domain image reflecting a magnetic domain structure in an actual state cannot be obtained. In order to solve the problem and obtain the magnetic domain contrast image conforming to the actual state, magnetic domain images in orthogonal directions may be synthesized. FIG. 9 shows an image obtained by synthesizing FIGS. 8A and 8B. By performing the above image processing by the image processing unit 21, the anisotropy is removed, and an isotropic magnetic domain image is obtained.

A system that smoothly executes the above image processing in the charged particle beam device may be implemented as shown in FIG. 1. The image processing procedure follows a flowchart shown in FIG. 2A. That is, the azimuth discrimination images corresponding to FIGS. 6A and 6B are acquired by the image acquiring device 1 (step 42) after the observation condition and the observation region are set (step 41). The acquired azimuth discrimination images are set as I1 and I2, and the shading correction processing is performed (step 43). The brightness and contrast of the two corrected images are adjusted (step 44), weights of the images are set, and the images are synthesized (step 45). The synthesized image is displayed as Isum on the GUI (step 46).

Here, when it is determined that the anisotropy is reduced and a desired magnetic domain contrast image is obtained (step 47), the images before and after the processing are stored in the database (step 48). Information generated or set in each step, such as the obtained azimuth discrimination images I1 and I2, shading correction parameters S1 and S2, brightness adjustment parameters B1 and B2, contrast adjustment parameters C1 and C2, and image synthesis processing parameters W1 and W2, is stored in the database each time (step 48).

FIG. 2B shows an example of the image database 26 of the image processing and image management device 20 as a table 33. The acquired image and a list of parameter setting values at the time of image processing are associated with an identifier such as a file name and stored as one data set. FIG. 2C shows an example of a list file of setting values of the image processing parameters for image data.

At the time of the observation, a user needs to determine a validity of the result based on the image generated in the processing of forming the finally obtained magnetic domain image. FIG. 10 shows an image display example of parameter setting and an observation result displayed on the GUI. A GUI 80 displays an image 85 not subjected to the image processing, an image 86 subjected to the shading processing and the contrast adjustment, and a synthesized image 87. In preparation for a case in which a magnetic domain contrast image desired by the user cannot be obtained when automatic control is performed from image acquisition to image processing, a configuration of the GUI in which settable processing parameters are displayed is desirable such that the processing parameters such as a shading correction 81, brightness 82, a contrast 83, and a weight 84 at the time of synthesis can be adjusted for each processing image. As described above, the image display unit 30 displays the GUI that sets, in addition to the image data indicating the magnetic domain contrast image, image processing parameters for the shading correction and the contrast adjustment that are performed by the image processing unit 21.

In consideration of a situation in which an image stored after completion of an image acquisition operation is called from the database and a parameter is edited, the image database 26 is constructed such that changed information can be stored together when a data set of an image not subjected to the image processing and an image subjected to the image processing that are acquired in the same visual field is displayed on the GUI and when parameters such as shading correction values (S1, S2), brightness (B1, B2), contrasts (C1, C2), and weights (W1, W2) at the time of synthesis are changed.

As another database structure, similar effect can be attained in a configuration in which each image is displayed on the GUI after the image acquisition operation is completed, and the data set of the image not subjected to the image processing and the image subjected to the image processing that are acquired in the same visual field is stored in the database when the parameter set is completed by the user.

The image processing of the shading correction may be any image processing as long as a desired background removal image can be obtained. However, as the shading correction performed by the image processing unit, background removal processing according to a Rolling Ball algorithm generally known in image processing software is particularly effective. The Rolling Ball algorithm is a method of ignoring a displacement of a local signal amount, measuring, as a background signal, a movement of a center of a spherical body when the spherical body (Ball) having a preset diameter rolls, and removing the movement from an original signal amount. A diameter of the sphere is a parameter for the shading correction. In the azimuth discrimination image of the SEM, a region that is more likely to be detected is observed to be bright, and other regions are observed to be dark in stages. The appearance of a luminance unevenness of the background signal at this time depends on an observation magnification, and the luminance unevenness is more likely to appear in a low-magnification image than in a high-magnification image. The background removal processing using the Rolling Ball algorithm is excellent in that desired shading correction can be performed without depending on the magnification of the azimuth discrimination image. Since intervals of the stripe patterns vary depending on the observation magnification, it is desirable that the user can adjust the observed magnetic domain contrast while viewing the obtained azimuth discrimination image on the GUI 80.

According to the present embodiment, it is possible to prevent an appearance of the shading contrast due to azimuth discrimination and to obtain a clear magnetic domain contrast image with a high resolution and a high throughput. When the SEM is used as the charged particle beam device, various analysis methods using an electron beam as a probe, such as energy dispersive X-ray analysis (EDX) and electron backscattering diffraction (EBSD), can be applied to the same region as the region where the magnetic domain contrast image is acquired. It is possible to provide a magnetic analysis device capable of observing a magnetic domain contrast image and analyzing a variety of samples in the same device.

Second Embodiment

A second embodiment is an embodiment of a charged particle beam device having a configuration in which secondary electrons emitted in azimuth angle ranges of two or more azimuths are detected at different times, that is, at different timings, a detector that causes an azimuth discrimination detection image to be acquired is a single detector, and a first emission azimuth discrimination image and a second emission azimuth discrimination image and a second emission azimuth discrimination images are acquired by different scans. In the single detector, a sensing surface is not divided.

FIG. 11A is a diagram showing an outline of a charged particle beam device according to the present embodiment. Matters described in the first embodiment and not described in the present embodiment are the same as those in the first embodiment. The present embodiment is different from the first embodiment in that, a detector 5 that causes the azimuth discrimination detection image to be acquired is the single detector 5, and the first emission azimuth discrimination image and the second emission azimuth discrimination image can be acquired by different scans. In the single detector 5, a sensing surface is not divided.

When an image is acquired in a manner of including the same region under two or more different azimuth discrimination conditions by the single detector 5, it is advantageous in that imaging conditions of the images can be unified, and on the other hand, it is necessary to adjust a deviation of a position or a size of the irradiation region for each image. It is necessary to specify the same region and acquire the image. In order to acquire azimuth discrimination images of two or more azimuths having different emission azimuths using a single detector, a rotation control function of a sample stage or the like is used. That is, the sample stage has a rotation function for the detector to detect, at different timings, secondary electrons emitted in azimuth angle ranges of two or more different azimuths. For example, when a specific azimuth discrimination condition is set under a certain condition, when an orientation of the sample is changed to an orthogonal direction using the rotation function of the sample stage, it is possible to acquire an azimuth discrimination image in which the emission azimuths are different in the orthogonal direction.

Since the anisotropy in which the magnetic domain contrast depends on the emission azimuth is superimposed by the azimuth discrimination detection, it is difficult to specify the same region only by the azimuth discrimination image. As one of methods for easily specifying a region, as shown in the schematic configuration diagram in FIG. 11B, a method is effective in which a sample surface is processed using a focused ion beam (hereinafter referred to as FIB) 92 and a mark is given to the same observation region which is a target region. In the first embodiment, a device configuration of the SEM alone is described. However, in the present embodiment, as shown in the drawing, a device configuration of FIB-SEM in which both an SEM 91 and the FIB 92 are mounted in the same sample chamber 10 is adopted, and thereby the FIB processing and the SEM observation can be performed in the sample chamber of the same device.

FIG. 12A shows a shape example of a processing trace serving as a mark when FIB processing is performed in an SEM observation region 109 of the magnetic sample 8. In consideration of later image synthesis, it is effective to form a processed shape in which a position, a size, and an orientation of the same observation region can be specified based on an arrangement of the processing trace. For example, in the case in FIG. 12A, among processing traces 101 to 108, only the processing trace 101 has a triangular shape, and the processing traces other than the processing trace 101 have a quadrangular shape.

FIG. 12B shows a flowchart of an image processing procedure according to the present embodiment. Although the basic procedure is similar as that of the flowchart according to the first embodiment, a step (step 49) of extracting the same observation region from a plurality of acquired images is added.

Third Embodiment

FIG. 13 is a conceptual diagram showing a configuration of the charged particle beam device according to the present embodiment. The difference in device configurations between the first and second embodiments is in that an angle-limited diaphragm 111 for the secondary electrons 4 and a second deflection unit 113 for the secondary electrons are provided on a sample side with respect to the detector 5. That is, the angle-limited diaphragm for the secondary electrons is provided between the detector and the sample, the second deflection unit is provided between the angle-limited diaphragm and the sample, and the control system controls a deflection direction and a deflection amount for the secondary electrons by the second deflection unit. Accordingly, the detector separately detects the secondary electrons emitted in the azimuth angle ranges of two or more different azimuths different from each other for the same observation region. In other words, the first deflection unit that deflects an electron beam, a second deflection unit that deflects the secondary electrons, and a control system that controls the first deflection unit and the second deflection unit are provided. The sample is irradiated with the electron beam from an electron beam source. By controlling a secondary electron trajectory by the second deflection unit having the device configuration, an azimuth discrimination image for any azimuth can be acquired, and an azimuth discrimination image of two or more azimuths for the same region can be acquired by the single detector.

The secondary electron deflection unit 113 uses any one of an electric field deflection field, a magnetic field deflection field, and an electromagnetic field superimposition deflection field. In the present embodiment, a description will be given of a case in which the secondary electron deflection unit 113 is a Wien filter. The Wien filter is formed such that the electric field deflection field and the magnetic field deflection field are orthogonal to each other in a direction orthogonal to an optical axis of an SEM through which an irradiation electron beam passes. When the secondary electron deflection unit 113 is a Wien filter, only the secondary electrons can be deflected out of the optical axis without deflecting the irradiation electron beam by adjusting the deflection intensities of an electric field deflector and a magnetic field deflector in advance by a control circuit 115 constituting a part of the control system 11. Therefore, it is possible to relatively freely control the deflection amount and the deflection direction of the secondary electrons while performing deflection control for the irradiation electron beam using the first deflection unit 114 by the control circuit 115 as in the related art.

FIG. 14A shows a distribution of the arrival positions on the angle-limited diaphragm 111 when the secondary electrons 4 are deflected in the direction of X>0 by the secondary electron deflection unit 113, and FIG. 14B shows a distribution of the arrival positions on the angle-limited diaphragm 111 when the secondary electrons 4 are deflected in the direction of Y>0. When the secondary electrons 4 are deflected in the direction of X>0, the region 123 where the secondary electrons pass through the angle-limited diaphragm 111 corresponds to the secondary electrons 4 emitted in the azimuth of X<0, and the azimuth discrimination image of X<0 can be obtained by detecting the secondary electrons 4 passing through the angle-limited diaphragm 111 by the detector 5. When the secondary electrons 4 are deflected in the direction of Y>0, the region 124 where the secondary electrons pass through the angle-limited diaphragm 111 corresponds to the secondary electrons 4 emitted in the azimuth of Y<0, and the azimuth discrimination image of Y<0 can be obtained by detecting the secondary electrons 4 passing through the angle-limited diaphragm 111 by the detector 5. By performing the above-described deflection control for each pixel at the time of acquiring the SEM image, it is possible to acquire an azimuth discrimination image of two or more azimuths for the same region using the single detector.

For the obtained azimuth discrimination image of two azimuths, shading correction and contrast adjustment are performed in the same manner as in the first embodiment according to the same flowchart as that shown in the first embodiment. Thereafter, image synthesis processing is performed, and thereby an isotropic magnetic domain image having reduced anisotropy is obtained.

Fourth Embodiment

A fourth embodiment is an embodiment of a charged particle beam device capable of observing an isotropic magnetic domain image on a GUI in real time by controlling a deflection intensity of a secondary electron deflection unit in conjunction with a deflection unit of an irradiation electron beam. In other words, according to the embodiment, the charged particle beam device includes an electron beam source, a sample stage, an objective lens, a first deflection unit that deflects an electron beam, a second deflection unit that deflects secondary electrons, and a control system that controls the first deflection unit and the second deflection unit. A sample is irradiated with the electron beam from an electron beam source. The control system controls a deflection intensity of the second deflection unit in conjunction with the first deflection unit.

FIG. 15 is a conceptual diagram showing a configuration of the charged particle beam device according to the present embodiment. In the first to third embodiments, since the magnetic domain image is displayed at the stage in which acquisition of an azimuth discrimination image of two azimuths and the image processing are completed, it is not possible to observe an isotropic magnetic domain image on a GUI in real time. According to the control circuit 115 which is a part of the control system according to the present embodiment, it is possible to observe an isotropic magnetic domain image on a GUI in real time by controlling the deflection intensity of the secondary electron deflection unit 113 in conjunction with the deflection unit 114 of the irradiation electron beam.

In the case of acquiring the azimuth discrimination image, the superimposition of shading cannot be avoided in principle. This is because the shading is caused mainly by a fact that secondary electrons in a certain azimuth are more likely to be detected and secondary electrons emitted to an opposite side thereof are less likely to be detected. Since whether the secondary electrons are more likely to be detected or less likely to be detected depends on a generation position of the secondary electrons 4, an influence is small in high magnification observation, and an adverse influence is likely to be manifested in low magnification observation.

Therefore, in the present embodiment, when an azimuth discrimination image of a certain azimuth is acquired, by changing the deflection intensity of the secondary electron deflection unit 113 such that the signal intensity serving as a base does not depend on a generation position of the secondary electrons 4, it is possible to obtain the azimuth discrimination image without shading. If there is no shading, the shading correction processing described in the first to third embodiments is unnecessary, and it is sufficient to perform the processing of contrast adjustment and image synthesis. If the discrimination detection signal of two azimuths is weighted for each azimuth and displayed as an addition signal in each pixel, an isotropic magnetic domain image can be observed in real time on the GUI.

The invention is not limited to the embodiments described above and includes various modifications. For example, the embodiments described above have been described in detail for better understanding of the invention, and the invention is not necessarily limited to those including all configurations described above.

Further, although an example of creating a program for implementing a part or all of the configurations, functions, image processing unit, and control system described above is mainly described, it is needless to say that a part or all of the configurations, functions, image processing unit, and control system may be implemented by hardware, for example, by designing an integrated circuit. That is, all or a part of functions of the image processing unit and the control system may be implemented by the integrated circuit such as an application specific integrated circuit (ASIC) or a field programmable gate array (FPGA) instead of the program.

REFERENCE SIGN LIST

1: image acquiring device
2: electron source
3: irradiation electron beam
4: secondary electron
5: detector
6: objective lens
7: electrode
8: sample (magnetic body)
9: sample stage
10: sample chamber
11: control system
20: image processing and image management device
21: image processing unit
22: shading correction processing unit
23: brightness and contrast adjustment unit
24: image synthesis unit
25: data buffer
26: image database 30: image display unit
31: acquired image or processing image
32: image processing parameter
33: table
51: leakage magnetic field on surface of magnetic sample
52: magnetic sample
53: local magnetization direction of magnetic sample
54: local magnetic domain of magnetic sample
61: secondary electron detector of four split sensing surface
62: through hole of irradiation electron beam
63: retarding power supply
64: retarding electric field
71: angle range of secondary electrons detected by detector A
72: angle range of secondary electrons detected by detector B
73: angle range of secondary electrons detected by detector B
74: angle range of secondary electrons detected by detector B
80: control GUI
81: adjustment unit of shading correction parameter
82: brightness adjustment unit
83: contrast adjustment unit
84: weight adjustment unit at the time of image synthesis
85: azimuth discrimination image before image processing
86: azimuth discrimination image after image processing
87: image after image synthesis processing
91: SEM column
92: FIB column
101 to 108: processing trace caused by FIB processing
109: SEM image of FIB processing region
111: angle-limited diaphragm for secondary electrons
112: opening portion of angle-limited diaphragm
113: deflection unit
114: deflection unit of irradiation electron beam
115: control circuit
121: deflection direction of secondary electron
122: arrival position on angle-limited diaphragm of secondary electrons when secondary electrons deflect to direction of X>0
123: secondary electrons passing through angle-limited diaphragm
124: arrival position on angle-limited diaphragm of secondary electrons when secondary electrons deflect to direction of X>0
125: secondary electrons passing through angle-limited diaphragm

The invention claimed is:

1. A charged particle beam device comprising:
a charged particle beam source configured to generate a charged particle beam;
a sample stage;
an objective lens configured to focus charged particle beams on a sample;
an electric field generation unit configured to apply an accelerating electric field to secondary electrons generated from the sample, the secondary electrons being distributed between the sample and the objective lens;
a detector that is mounted on a charged particle beam source side with respect to the objective lens and is capable of separately detecting secondary electrons emitted in azimuth angle ranges of two or more different azimuths for the same observation region; and
an image processing unit configured to perform synthesis by performing shading correction and contrast adjustment on an image obtained by detecting a first emission azimuth by the detector and an image obtained by detecting a second emission azimuth by the detector.

2. The charged particle beam device according to claim 1, further comprising:
an image database that accumulates the image; and
an image display unit configured to display the image synthesized by the image processing unit.

3. The charged particle beam device according to claim 2, wherein
the image display unit displays a GUI configured to set an image processing parameter for the shading correction and the contrast adjustment that are performed by the image processing unit.

4. The charged particle beam device according to claim 3, wherein
the image displayed on the image display unit is a magnetic domain contrast image of the sample.

5. The charged particle beam device according to claim 1, wherein
the first emission azimuth and the second emission azimuth are azimuths in which central azimuths thereof are substantially orthogonal to each other.

6. The charged particle beam device according to claim 1, wherein
in a sensing surface of the detector configured to detect the first emission azimuth and a sensing surface of the detector configured to detect the second emission azimuth, azimuths at central portions of the sensing surfaces of the detectors facing from an optical axis are substantially orthogonal to each other.

7. The charged particle beam device according to claim 1, wherein
the detector has a sensing surface divided into a plurality of pieces that are symmetrical relative to an optical axis.

8. The charged particle beam device according to claim 1, wherein
the shading correction performed by the image processing unit uses a Rolling Ball algorithm.

9. The charged particle beam device according to claim 1, wherein
the detector detects the secondary electrons emitted in azimuth angle ranges of two or more different azimuths at different timings.

10. The charged particle beam device according to claim 9, wherein
the sample stage has a rotation function for the detector to detect, at different timings, the secondary electrons emitted in azimuth angle ranges of two or more different azimuths.

11. The charged particle beam device according to claim 9, wherein
a scanning electron microscope including an electron beam source which is the charged particle beam source, the sample stage, the objective lens, and a first deflection unit configured to deflect an electron beam with which the sample is irradiated from the electron beam source, and a focused ion beam device configured to process the sample are mounted.

12. The charged particle beam device according to claim 11, wherein
a surface of the sample is processed using the focused ion beam device, and a mark of the same observation region is attached.

13. The charged particle beam device according to claim 9, wherein
the charged particle beam device is a scanning electron microscope that includes an electron beam source which is a charged particle beam source, the sample stage, the objective lens, the first deflection unit configured to deflect an electron beam with which the sample is irradiated from the electron beam source, the second deflection unit configured to deflect the secondary electrons, and the control system configured to control the first deflection unit and the second deflection unit.

14. The charged particle beam device according to claim 13, wherein
an angle-limited diaphragm for the secondary electrons is provided between the detector and the sample;
the second deflection unit is provided between the angle-limited diaphragm and the sample; and
the control system controls a deflection direction and a deflection amount for the secondary electrons by the second deflection unit, and thereby the detector separately detects the secondary electrons emitted in azimuth angle ranges of two or more different azimuths for the same observation region.

15. The charged particle beam device according to claim 13, wherein
the control system controls a deflection intensity of the second deflection unit in conjunction with the first deflection unit.

\* \* \* \* \*